United States Patent [19]
Hirumachi

[11] Patent Number: 5,633,587
[45] Date of Patent: May 27, 1997

[54] MAGNETOSTATIC FIELD GENERATING MAGNET FOR USE IN AN MRI SYSTEM HAVING AN ACTIVE MAGNETIC SHIELD

[75] Inventor: Tamiko Hirumachi, Tokyo, Japan

[73] Assignee: Kabushiki Kaisha Toshiba, Kawasaki, Japan

[21] Appl. No.: 600,031

[22] Filed: Feb. 12, 1996

[30] Foreign Application Priority Data

Feb. 14, 1995 [JP] Japan ................................... 7-025170

[51] Int. Cl.$^6$ ........................................................ G01V 3/00
[52] U.S. Cl. ........................................ 324/319; 324/320
[58] Field of Search ............................... 324/319, 320, 324/318, 322; 335/216, 299

[56] References Cited

U.S. PATENT DOCUMENTS

| | | | |
|---|---|---|---|
| 5,276,399 | 1/1994 | Kasten et al. | 324/319 |
| 5,359,310 | 10/1994 | Pissanetzky | 324/319 |
| 5,426,366 | 6/1995 | Overweg et al. | 324/319 |

FOREIGN PATENT DOCUMENTS

| | | |
|---|---|---|
| 0144171 | 6/1985 | European Pat. Off. . |
| 0167243 | 1/1986 | European Pat. Off. . |
| 0488464 | 6/1992 | European Pat. Off. . |

OTHER PUBLICATIONS

Cryogenics, vol. 24, No. 2, pp. 59–62, Feb. 1984, K. Pieterman, et al., "A 1.5 T Superconducting Magnet With Closed Cooling System for Spin–Imaging: An Outline".

Primary Examiner—Louis M. Arana
Attorney, Agent, or Firm—Oblon, Spivak, McClelland, Maier & Neustadt, P.C.

[57] ABSTRACT

A magnetostatic field generating magnet includes small-diameter coils for generating a low-order magnetic component, a large-diameter coil for generating a high-order magnetic component, a first coil assembly for generating in a predetermined area a main magnetic field obtained by both the low- and high-order magnetic components, and a second coil assembly for generating a shield magnetic field for actively shielding a magnetic field leaking from the main magnetic field.

13 Claims, 8 Drawing Sheets

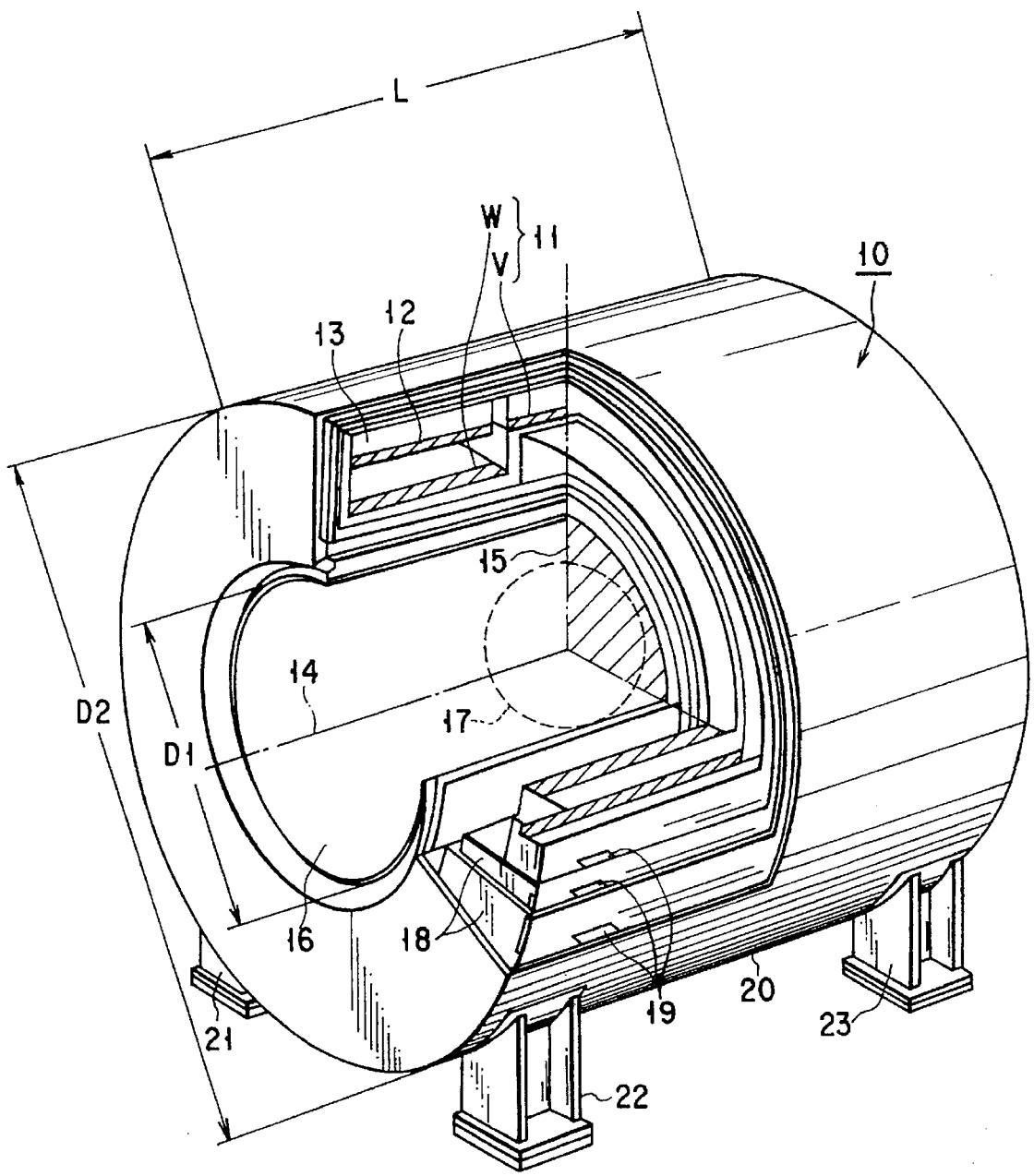
F I G. 3

MAGNETOSTATIC FIELD GENERATING MAGNET FOR USE IN AN MRI SYSTEM HAVING AN ACTIVE MAGNETIC SHIELD

BACKGROUND OF THE INVENTION

1. Field of the Invention

The present invention relates to an MRI system and, more particularly, to a magnetostatic field generating magnet having an active magnetic shield.

2. Description of the Related Art

There are a permanent magnet, a normal conductive magnet, and a superconductive magnet as a magnetostatic field generating magnet provided with an MRI system. Since this type of magnetostatic field generating magnet is installed inside a hospital, a magnetic field leaking from the magnet has to be reduced to a minimum in order to eliminate a magnetically adverse effect to an ambience. The magnet is thus usually coated with a magnetic shield. Three magnetic shields, i.e., an iron yoke magnetic shield, an active magnetic shield and a hybrid magnetic shield have been put to practical use. Of these, the active magnetic shield necessitates no special shielding members and lightens the magnetostatic field generating magnet; therefore, it has an advantage in being placed inside a hospital and in particular it is effective in serving as a magnetic shield of a superconductive electrostatic field generating magnet.

A prior art magnetostatic field generating magnet and its magnetic shield, and an MRI system with such a magnet, will now be described with reference to the accompanying drawings. The magnetostatic field generating magnet is of a superconductive type.

FIG. 1 is a perspective, cutaway view of an active magnetic shield type magnet as disclosed in Jpn. Pat. Appln. KOKAI Publications Nos. 60-98344 and 60-123756. In FIG. 1, a magnetostatic shield generating magnet 60 includes a first superconductive coil assembly 61 for generating first magnetism as the main magnetism and a second superconductive coil assembly (active magnetic shield) 62 for generating second magnetism which is formed on the outer periphery of the assembly 61 and electrically connected in series thereto. These first and second assemblies are contained in a liquid helium tank 63 filled with liquid helium and held to an extremely low temperature of 4.2 K. To use the magnet 60 for an MRI system, the uniformity of magnetism is essential. In FIG. 1, reference numeral 64 indicates the axis of magnetism, 65 denotes the central plane of the MRI system, and 66 represent a normal temperature bore. The bore 66 is a space in which a subject to be examined is inserted.

FIG. 2 is a diagram showing an example of the relationship in coil arrangement between the first and second superconductive coil assemblies 61 and 62. Each of the assemblies has six superconductive coils. More specifically, the first assembly 61 includes three pairs of coils A and A', B and B' and C and C', while the second assembly 62 also includes three pairs of coils D and D', E and E' and F and F'. These coils are arranged along the axis 64, and the respective paired coils are symmetrical with regard to the central plane 64 which is perpendicular to the axis 64.

The above-described prior art superconductive magnetostatic field generating magnet having an active magnetic shield is operated as follows. The first and second superconductive coil assemblies 61 and 62 generate magnetism whose high-order magnetic components are substantially the same in intensity, and supply the uniformly synthesized magnetism to the central interaction space of the normal temperature bore 66. Since the direction of current flowing through the second assembly 62 is opposite to that of current flowing through the first assembly 61, the magnetism generated from the second assembly 62 cancels that from the first assembly 61 outside the magnet 60, thereby reducing in leaking magnetism.

The magnetism generated from the first superconductive coil assembly 61 is expressed by high-order magnetic components as follows:

$$B1 = b01 + b11 + b21 \text{l} b31 \text{l} \tag{1}$$

where B1 is intensity of the magnetism, b01 is that of zero-order magnetism, b11 is that of primary magnetism, b21 is that of secondary magnetism, and b31 is that of tertiary.

Similarly, the magnetism generated from the second superconductive coil assembly 62 is expressed by high-order magnetic components as follows:

$$B2 = b02 + b12 + b22 + b32 \tag{2}$$

where B2 is intensity of the magnetism, b02 is that of zero-order magnetism, b12 is that of primary magnetism, b22 is that of secondary magnetism, and b32 is that of tertiary.

Since the corresponding high-order magnetism intensities b11 and b12, b21 and b22, b31 and b32, ... are almost equal to each other in the above equations (1) and (2), the high-order terms become almost zero, with the result that the magnetism is highly uniformed in the normal temperature bore 66. Since, furthermore, the polarities of B1 and B2 are opposite to each other, the magnetism is canceled outside the magnet and the leaking magnetism is decreased.

The prior art superconductive magnetostatic field generating magnet 60 with the foregoing structure, has the following drawbacks. In the active magnetic shield of the magnet, the second superconductive coil assembly 62 through which the current flows in the direction opposite to that of the current flowing through the first superconductive coil assembly 61, is disposed on the outer periphery of the assembly 61. However, in order to greatly uniformize the magnetism in the bore 66, the corresponding high-order magnetic components of the magnetism generated by the first and second assemblies 61 and 62 need to be almost equal to each other, so that the magnet 60 is greatly lengthened.

According to the above publication No. 60-123756, in a 1.5 T magnet having a conventional active magnetic shield, the length of the magnet is 2.3 m and so is the diameter thereof. When the magnet is installed in a hospital, it is very difficult to carry the magnet through a passageway, especially a corner thereof. It is thus necessary to expand the passageway or make a room exclusively for the magnet.

The prior art superconductive magnetostatic field generating magnet is therefore disadvantageous in practicability because of great measurements. If the magnet 60 is long and narrow, a patient lying in the normal temperature bore 66 will strongly feel himself or herself enclosed or confined and reject the magnet.

Moreover, since the high-order magnetic components are cancel each other only by the second superconductive coil assembly 62 formed on the outer periphery of the first superconductive coil assembly 61, it is essentially difficult to make the high-order terms zero, and a uniform magnetic space cannot be enlarged.

SUMMARY OF THE INVENTION

An object of the present invention is to provide a magnetostatic field generating magnet and an MRI using the magnet which generates a highly uniform magnetic field, which can be made compact and thus easily carried and installed in the existing hospital, and which does not make a patient feel enclosed or confined.

The above object is attained by the following magnetostatic field generating magnet.

The magnetostatic field generating magnet comprises:

a first coil assembly having small-diameter coils and a large-diameter coil, for generating a main magnetic field in a predetermined area; and a second coil assembly for generating a shield magnetic field for actively shielding a magnetic field leaking from the main magnetic field.

The small- and large-diameter coils are arranged in association with the second coil assembly and the predetermined area in such a manner that the small-diameter coils generate a low-order magnetic component in the predetermined area and the large-diameter coil generates a high-order magnetic component in the predetermined area.

The large-diameter coil is separated from the predetermined area and the small-diameter coils.

The second coil assembly is separated from the predetermined area and the first coil assembly, and the large-diameter coil is arranged in association with the second coil assembly.

The small- and large-diameter coils are arranged along a magnetic axis through the predetermined area, and the large-diameter coil is arranged close to the predetermined area.

The small-diameter coils are arranged on both sides of the large-diameter coil. The small- and large-diameter coils are arranged along a magnetic axis through the predetermined area, the small-diameter coils are arranged close to the predetermined area, and the large-diameter coil is arranged on both sides of the small-diameter coils.

The large-diameter coil generates a zero-order magnetic field in a central part of the predetermined area, and the zero-order magnetic field is about 5% of a synthesized magnetic field generated in the predetermined area.

When the length of the magnet is L and the diameter of the predetermined area is D1, $L/D1 \leq 2.1$.

When the outside diameter of the magnet is D2 and the diameter of the predetermined area is D1, $D2/D1 \leq 2$.

The first and second coil assemblies are superconductive coil assemblies.

The above object is also attained by the following MRI system.

The MRI system comprises:

a container having a subject insertion space;

a first coil assembly contained in the container, together with a cooling medium, and having small-diameter coils and large-diameter coil, for generating a main magnetic field in a predetermined area;

a second coil assembly contained in the container, together with the cooling medium, for generating a shield magnetic field for actively shielding a magnetic field leaking from the main magnetic field;

a gradient magnetic field generating section arranged in the subject insertion space of the container;

an RF unit arranged in the subject insertion space of the container; and an electric unit for controlling the gradient magnetic field generating section and the RF unit and generating magnetic resonance information in response to a magnetic resonance signal from the RF unit.

The MRI system further comprises an active gradient shield coil section for active-gradient-shielding a gradient magnetic field generated by the gradient magnetic field generating section.

According to the present invention, the large-diameter coil of the first coil assembly compensate for high-order magnetic components (high-order errors). The distance between the coil center and each of the large-diameter coils is greater than that between the coil center and each of the small-diameter coils, and the large-diameter coil is arranged close to the second coil assembly; thus, only a little magnetic field leaks.

The magnetostatic field generating magnet of the present invention is applied to a superconductive magnetostatic generating magnet. In this magnet, at least part of the first coil assembly (e.g., large-diameter coil arranged in the central part of the assembly or in the vicinity of both ends thereof) can be provided on the outer periphery of the second coils assembly. Thus, the coils generating the high-order magnetic components are located away from the operation space in a normal temperature bore, and a highly uniform and large magnetic space can easily be obtained in the normal temperature bore and at the same time a leaking magnetic field is reduced outside the magnet. Since, furthermore, the magnet can be shortened, it can easily be carried and installed in the existing hospital, and does not make a patient feel enclosed or confined.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a perspective, cutaway view of a superconductive magnetostatic field generating magnet of an MRI system according to a first embodiment of the present invention.

DETAILED DESCRIPTION OF THE PREFERRED EMBODIMENTS

Figure 1:
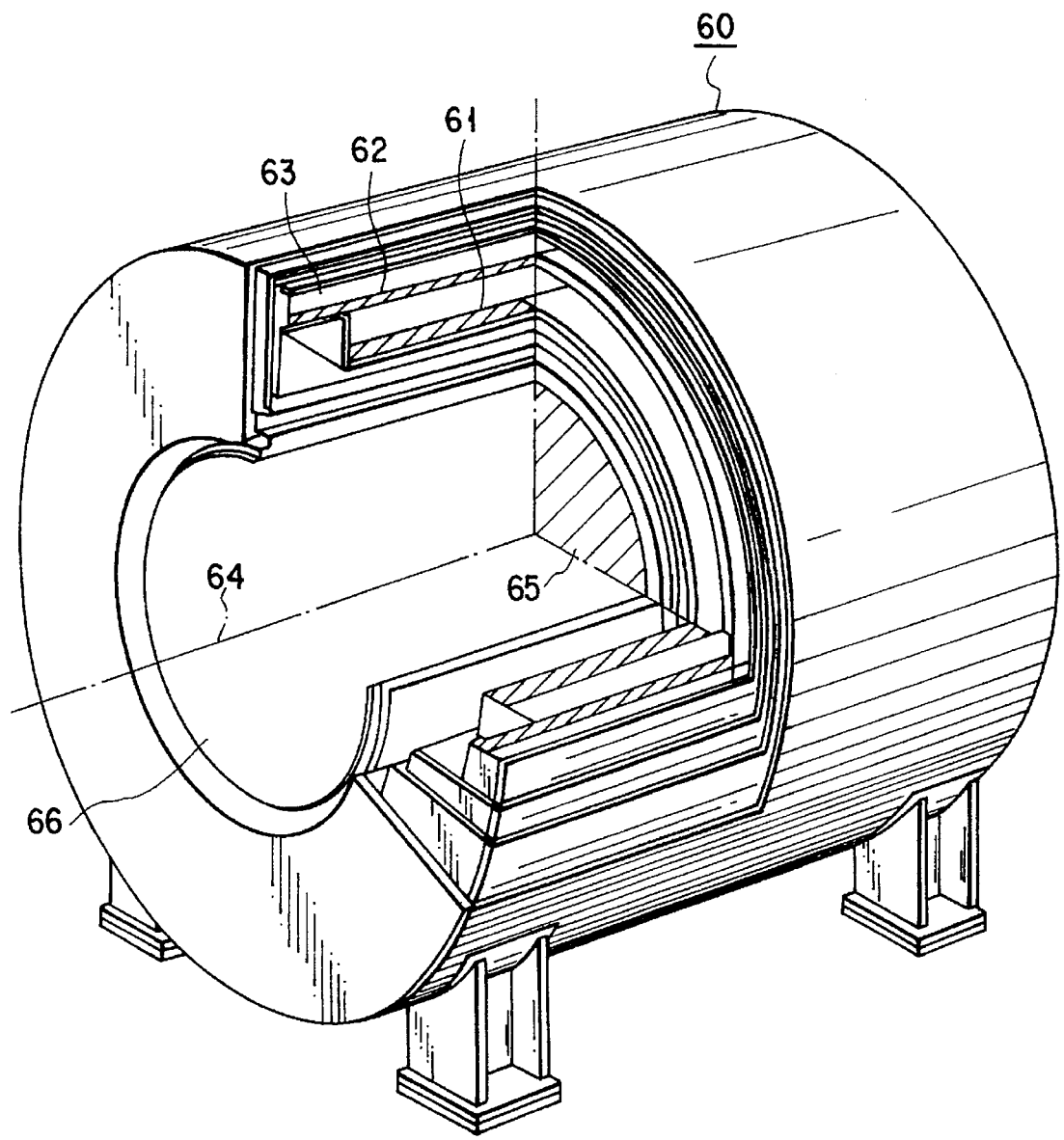
FIG. 1 is a perspective, cutaway view of a prior art magnetostatic field generating magnet including an active magnetic shield.
Figure 2:
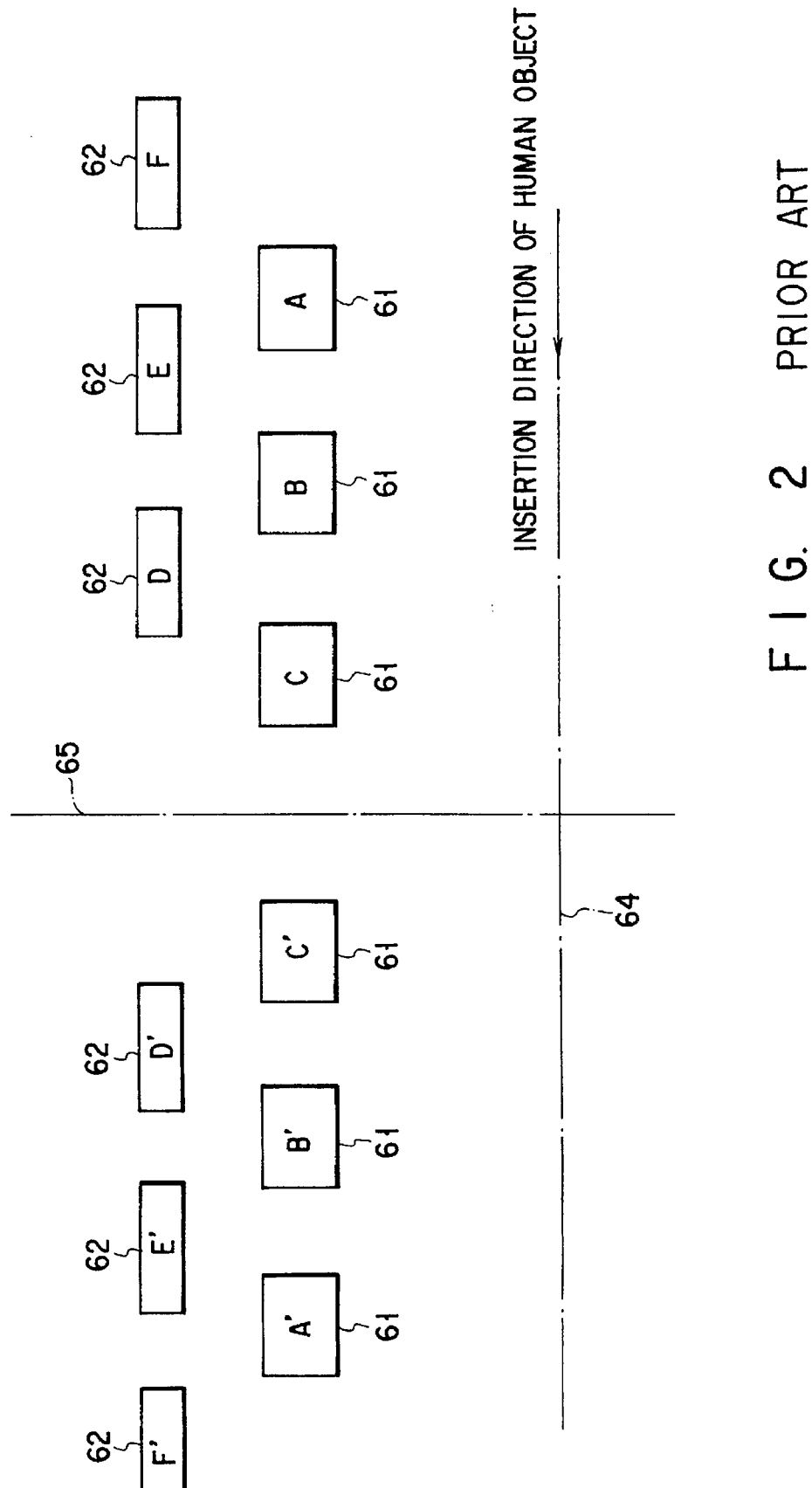
FIG. 2 is a diagram showing the relationship in arrangement between coils of the prior art magnetostatic field generating magnet.

Embodiments of the present invention will now be described.

FIG. 3 is a perspective, cutaway view of a superconductive magnetostatic field generating magnet of an MRI system according to a first embodiment of the present invention. In FIG. 3, the magnetostatic field generating magnet 10 includes a first superconductive coil assembly 11 having small- and large-diameter coils for generating first magnetism as the main magnetism and a second superconductive coil assembly (active magnetic shield) 12 for generating second magnetism. The second superconductive coil assembly 12 is formed so as to surround the first assembly 11, except for part thereof, and electrically connected in series to the first assembly 11.

The first and second assemblies 11 and 12 generate magnetism, which becomes zero by synthesizing high-order magnetic components corresponding to the first and second magnetisms, in an inner space 17 of a normal temperature bore 16. The second magnetism is set opposite to the first magnetism outside the magnet.

The first superconductive coil assembly 11 includes a large-diameter coil section V in the middle thereof along the magnetic axis 14 thereof, and the coil section V is formed on the outer periphery of the second assembly 12. The first and second assemblies 11 and 12 are contained in a liquid helium tank 13 filled with liquid helium and held to an extremely low temperature of 4.2 K. A heat radiation shield 18 and a multilayer heat insulating material 19 are wrapped around the tank 13, and these are contained in a vacuum container 20. The container 20 has a heat insulating structure with a high vacuum state inside and is supported by four legs 21 to 24 (24 is not shown). The vacuum container 20 including the liquid helium tank 13 is a container having a space into which a subject to be examined is introduced and this space corresponds to the normal temperature bore 16.

The large-diameter coil section V is so constructed that the zero-order magnetic component generated therefrom in the central portion of the magnet 10 is about 5% of the synthesized magnetic components. If the length of the magnet 10 is L and the diameter of the bore 16 is D1, $L/D1 \leq 2.1$, while the outside diameter of the magnet is D2 and the diameter of the bore 16 is D1, $D2/D1 \leq 2$.

Figure 4:
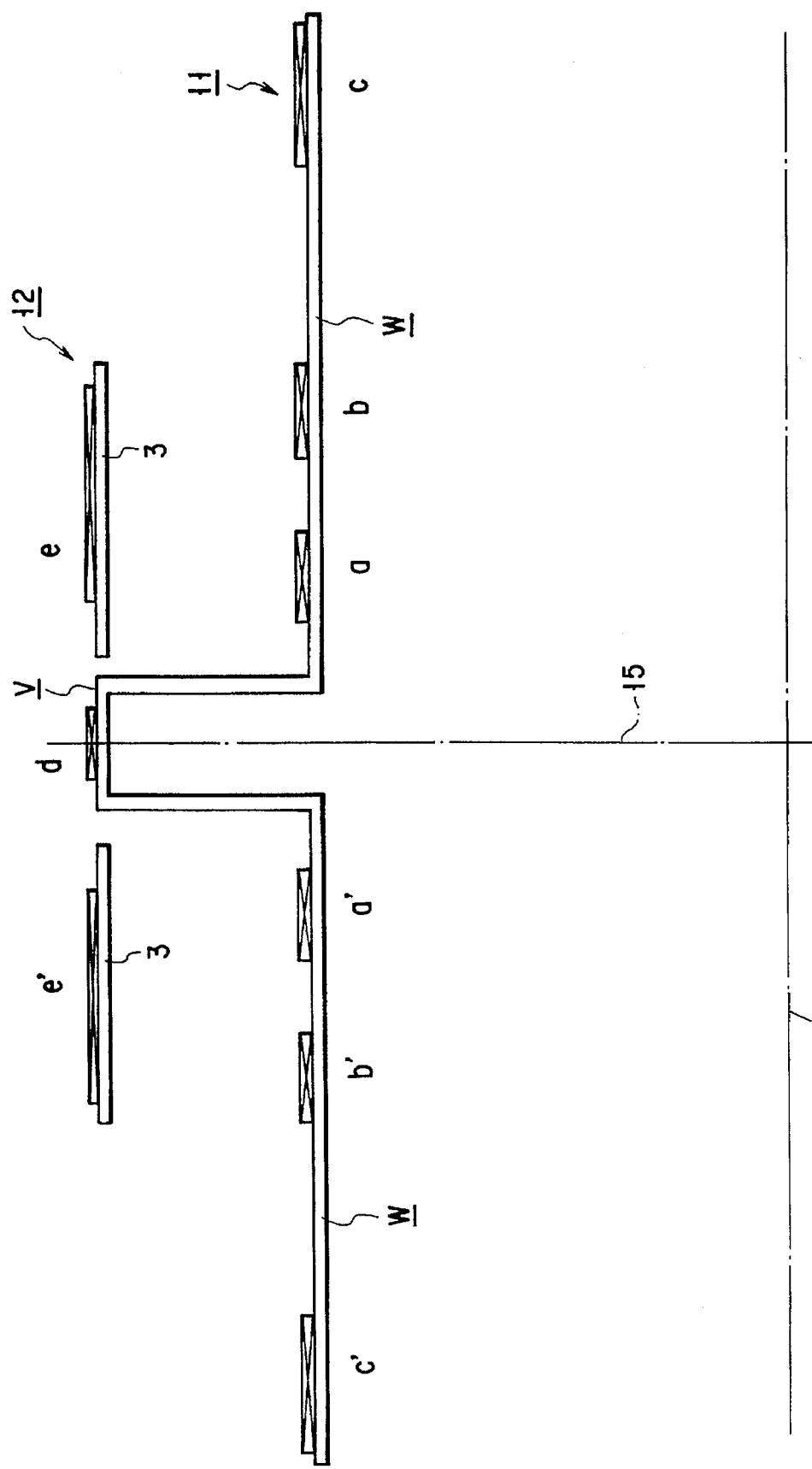
FIG. 4 is a cross-sectional view showing the relationship in arrangement between superconductive coils of the magnet shown in FIG. 3.

FIG. 4 is a cross-sectional view which is taken in a direction perpendicular to the magnetic axis 14 to specifically show the relationship in arrangement among the coils. While the first superconductive coil assembly 11 has seven superconductive coils a to c, a' to c' and d, the second superconductive coil assembly 12 does two superconductive (active) coils e and e'. The large- and small-diameter coil sections V and W of the first assembly 11 are arranged concentrically along the magnetic axis 14, and each of the sections is formed symmetrically with respect to a common central plane 15 perpendicular to the axis 14. More specifically, the superconductive coil d constituting the large-diameter coil V is located in a position corresponding to the common central plane 15, whereas the respective paired coils a and a', b and b' and c and c' constituting the small-diameter coil section W are symmetrical with regard to the plane 15. The second superconductive coil assembly 12 is so constituted that it surrounds the outer periphery of the small-diameter coil section W of the first superconductive coil assembly 11 and the active coils e and e' are arranged symmetrically with respect to the common central plane 15. Between these active coils e and e', the large-diameter coil section V, i.e., the superconductive coil d is arranged outside the second assembly 12.

Figure 5:
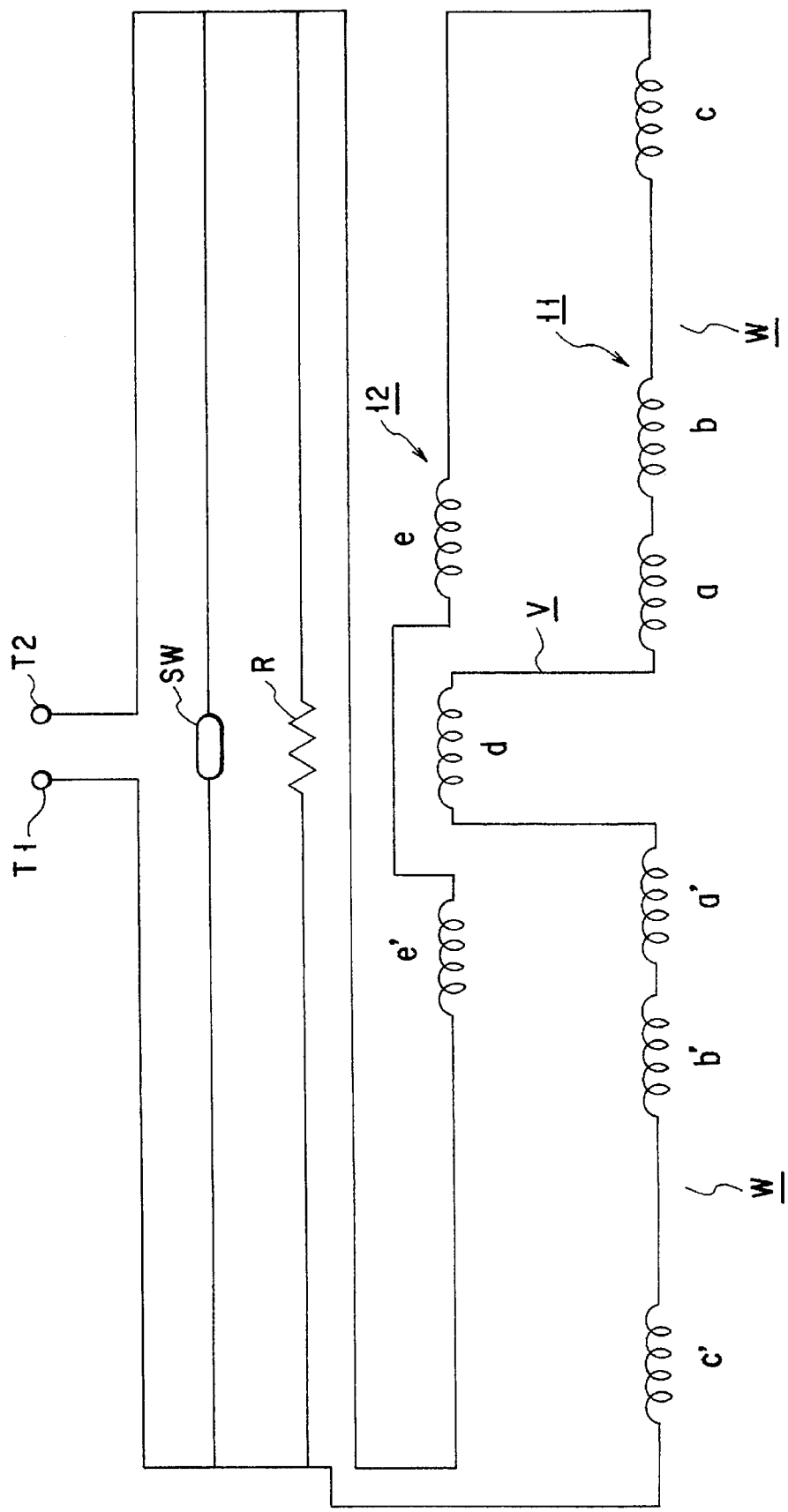
FIG. 5 is a wiring diagram showing a connecting state of the superconductive coils of the magnet shown in FIG. 3.

FIG. 5 is a wiring diagram showing the superconductive coils of the first and second superconductive coil assemblies 11 and 12 shown in FIG. 4. As illustrated in FIG. 5, the seven coils c', b', a', d, a, b and c of the first assembly 11 are connected in series, as are the two coils of the second assembly 12. One end of the coil c' and one end of the coil e' are connected to power supply terminals T1 and T2, respectively. In FIG. 5, SW indicates a permanent current switch and R denotes a protective resistor for protecting the coil-damage when the quench phenomenon happened.

First, the magnetism generated from the first superconductive coil assembly 11 is expressed by high-order magnetic components as follows:

$$M_M = (b0_M + b0'_M) + (b1_M + b1'_M) + \qquad (3)$$
$$(b2_M + b2'_M) + (b3_M + b3'_M) + \ldots$$

where $B_M$: intensity of magnetism generated by the first superconductive coil assembly 11;

$b0_M$: intensity of zero-order magnetism generated by the small-diameter coil section W of the first superconductive coil assembly 11;

$b0'_M$: intensity of zero-order magnetism generated by the large-diameter coil section V of the first superconductive coil assembly 11;

$b1_M$: intensity of first-order magnetism generated by the small-diameter coil section W of the first superconductive coil assembly 11;

$b1'_M$: intensity of first-order magnetism generated by the large-diameter coil section V of the first superconductive coil assembly 11;

$b2_M$: intensity of second-order magnetism generated by the small-diameter coil section W of the first superconductive coil assembly 11;

$b2'_M$: intensity of second-order magnetism generated by the large-diameter coil section V of the first superconductive coil assembly 11;

$b3_M$: intensity of third-order magnetism generated by the small-diameter coil section W of the first superconductive coil assembly 11; and $b3'_M$: intensity of third-order magnetism generated by the large-diameter coil section V of the first superconductive coil assembly 11.

Then, the magnetism generated from the second superconductive coil assembly 12 (active magnetic shield) is expressed by high-order magnetic components as follows:

$$BA = b0 A + b1A + b2A + b3A + \ldots \qquad (4)$$

where

BA: intensity of magnetism generated by the second superconductive coil assembly 12;

b0A: intensity of zero-order magnetism generated by the coil assembly 12;

b1A: intensity of first-order magnetism generated by the coil assembly 12;

b2A: intensity of second-order magnetism generated by the coil assembly 12; and b3A: intensity of third-order magnetism generated by the coil assembly 12.

In the above equations (3) and (4), the corresponding high-order components can be represented as follows:

$b1_M + b1'_M - b1A = 0$ $b2_M + b2'_M - b2A = 0$ $b3_M + b3'_M - b3A = 0$

The high-order terms are almost zero and the highly uniform magnetism is obtained in the inner space 17 of the normal temperature bore 16.

Since the polarities of $B_M$ and BA are opposite to each other outside the magnet 10, the magnetism is canceled and the leaking magnetism is decreased. If, for example, in a 0.5 T magnet, the central magnetism (zero-order magnetic component) of the coil d is 0.025 T (synthesized magnetism), the length of the magnet can be reduced from 2200 mm, which is that of a conventional magnet, to 1700 mm, and the uniform space can be doubled. Also, the outside diameter of the magnet can be reduced from 1665 mm to 1600 mm.

Figure 6:
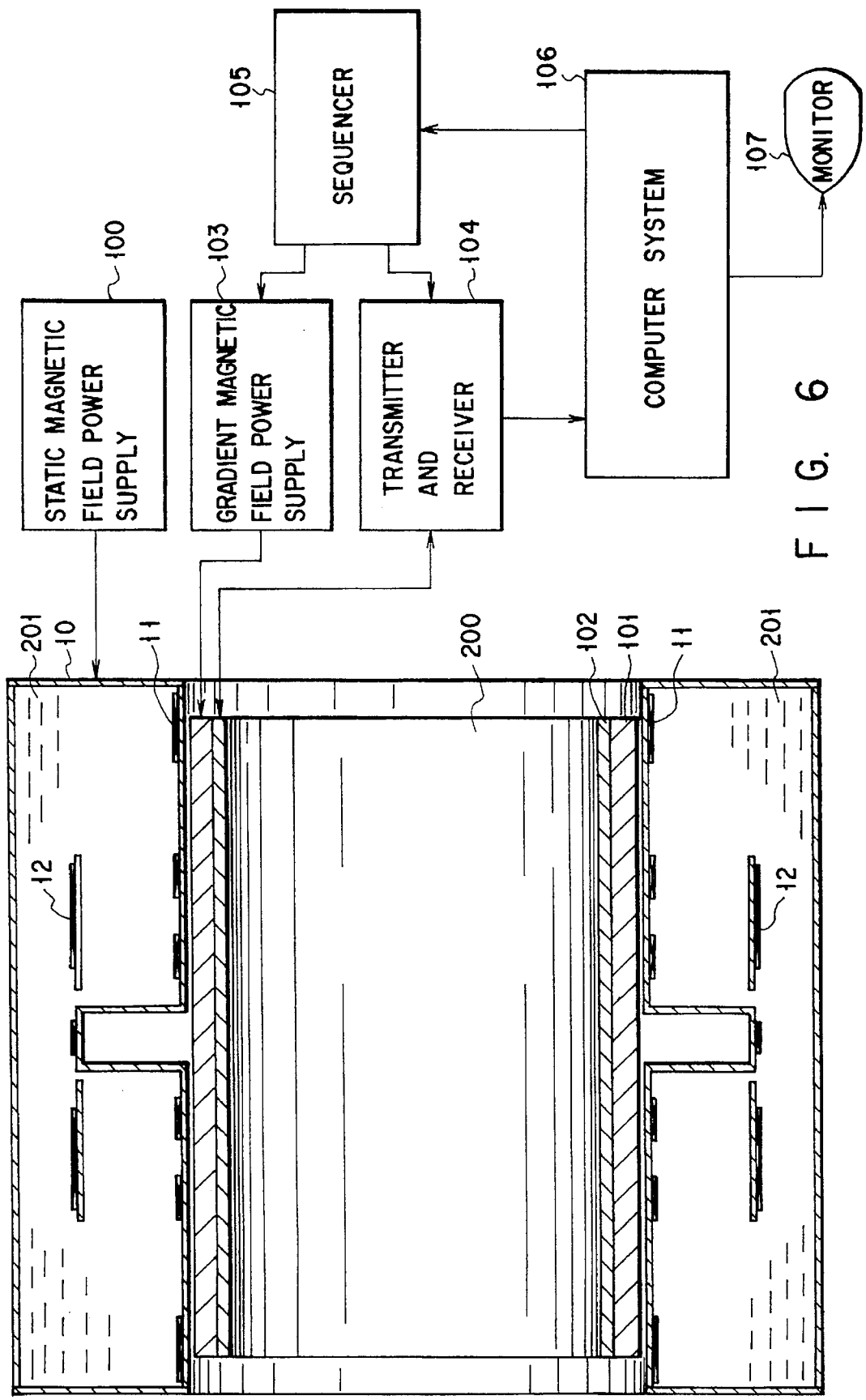
FIG. 6 is a view of an MRI system using the superconductive coils of the magnet shown in FIG. 3.

An MRI system using the foregoing coils of the first embodiment, will now be described, with reference to FIG. 6. The MRI system includes a vacuum container having a columnar subject insertion space 200 as a normal temperature bore. The liquid helium tank 13 of the vacuum container 10 contains a first superconductive coil assembly 11 together with a cooling medium 201. This assembly 11 includes small-diameter coils a, a', b, b', c and c', and a large-diameter coils d. These coils are connected in series, as shown in FIG. 5, and generate the main magnetic field in the central part of the subject insertion space 200. A subject to be examined, not shown, is placed in the space 200.

The liquid helium tank 13 of the vacuum container 10 also contains a second superconductive coil assembly 12 together with a cooling member 201. The second assembly 12 has two coils e and e' and generates a shield magnetic field for actively shielding a magnetic field leaking from the main magnetism of the first assembly 11. The first and second assemblies 11 and 12 are connected in series and energized by a static magnetic field power supply 100.

A gradient magnetic field generating coil section 101 and an RF coil section 102 are disposed in the subject insertion space 200 of the vacuum container 10. These coil sections 101 and 102 are constructed cylindrically such that a subject can be inserted thereinto. The coil section 101 includes an X-axis gradient magnetic field generating coil, a Y-axis gradient magnetic field generating coil and a Z-axis gradient magnetic field generating coil, while the RF coil section 102 includes transmission and reception coils. The coil section 101 is energized by a gradient magnetic field power supply 103. The RF coil section 102 is driven by a transmitter/receiver 104. The gradient magnetic field power supply 103 and RF coil section 102 are controlled by a sequencer 105. The sequencer 105 controls the RF coil section 102 and gradient magnetic field power supply 103 in accordance with the magnetic resonance pulse sequence of the spin echo technique.

By executing the pulse sequence, a magnetic resonance phenomenon is caused on a specific part of the subject to be examined and accordingly the RF coil section 102 produces a magnetic resonance signal. This signal is processed by a computer system 106 to generate magnetic resonance information of a magnetic resonance tomographic image, and the image is displayed on a monitor 107. The static magnetic field power supply 100, gradient magnetic field power supply 103, transmitter/receiver 104, RF coil section 102, computer system 106 and monitor 107 constitute an electric unit.

The above-described MRI system can be provided with an active gradient shield coil section for active-gradient-shielding a gradient magnetic field generated by the coil section 101.

A superconductive magnetostatic field generating magnet according to a second embodiment of the present invention, will now be described. The second embodiment is the same as the first embodiment shown in FIGS. 3 to 5, except for the structures of the first and second superconductive coil assemblies.

Figure 7:
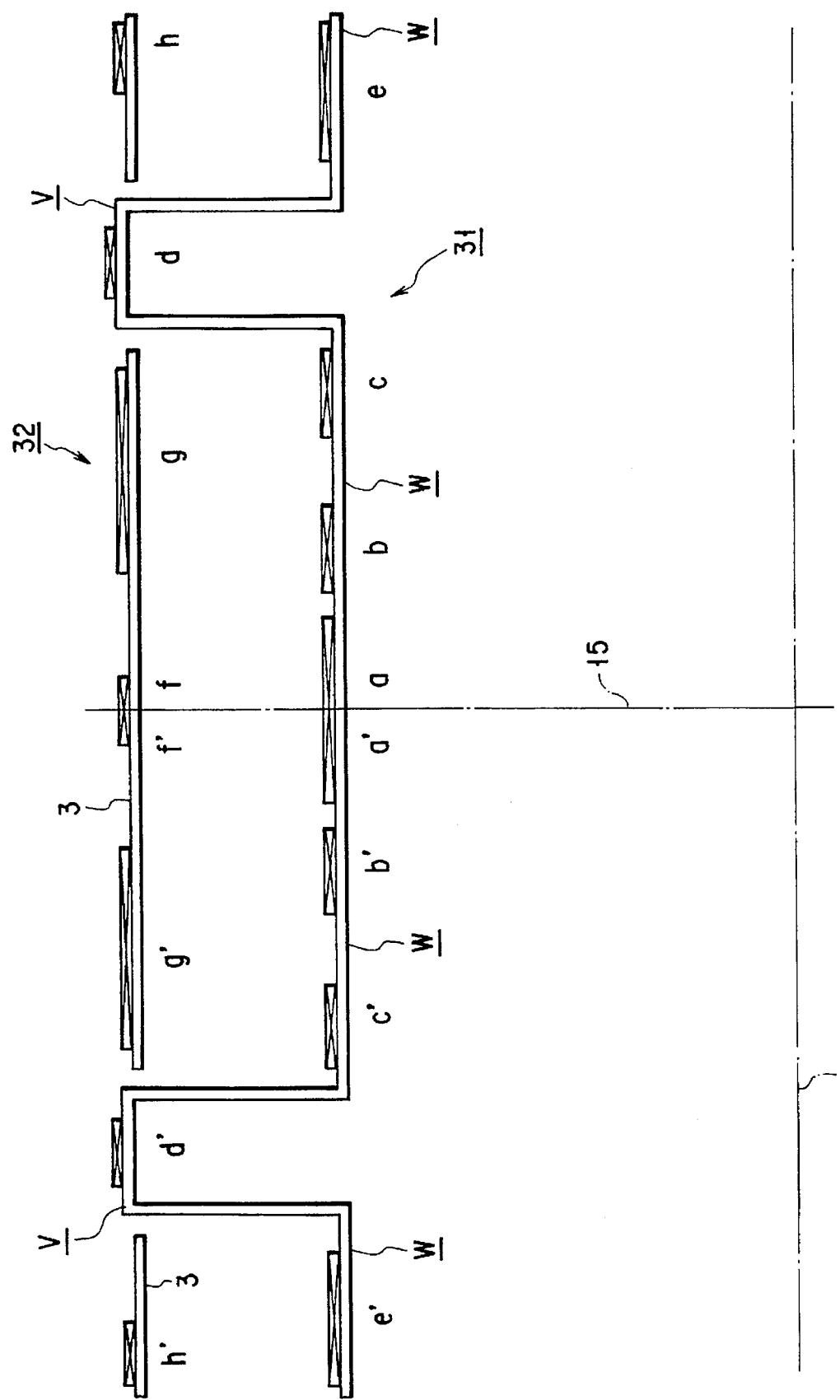
FIG. 7 is a cross-sectional view showing the relationship in arrangement between superconductive coils of a superconductive magnetostatic field generating magnet according to a second embodiment of the present invention.

FIG. 7 is a cross-sectional view which is taken in a direction perpendicular to the magnetic axis 14 to specifically show the relationship in arrangement among the coils. While the first superconductive coil assembly 31 has nine superconductive coils a to e and b' to e', the second superconductive coil assembly 32 does five superconductive coils f to h and g' to h'. Though the coil a is actually a single component, it is divided into two coils a and a' with respect to the common central plane 15 in FIG. 7 for convenience sake. The same is true of the superconductive coils f and f'.

As illustrated in FIG. 7, the coils of first superconductive coil assembly 31 are arranged concentrically along the magnetic axis 14 and symmetrically with respect to the common central plane 15 perpendicular to the axis 14. More specifically, the respective paired coils a and a', b and b', c and c', d and d' and e and e' are symmetrical with each other. The first assembly 31 includes two large-diameter coil sections V having a pair of coils located in the vicinity of both ends of the assembly 31, for example, the pair of coils d and d'. The other sections of the first assembly 31 are small-diameter coil sections W.

The respective pairs of coils f and f', g and g' and h and h' constituting the second superconductive coils assembly 32 are also symmetrical with regard to the common central plane 15.

Figure 8:
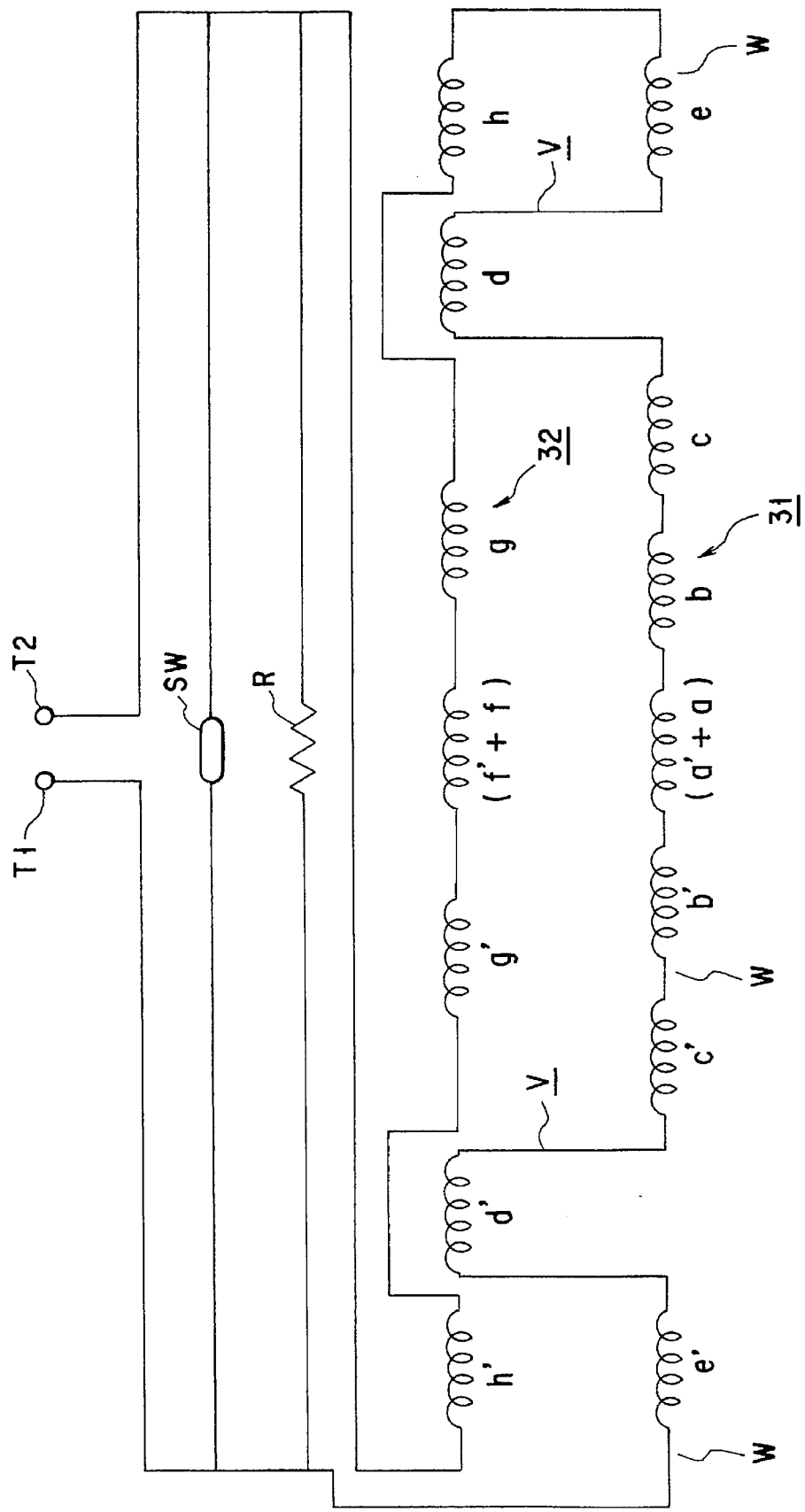
FIG. 8 is a wiring diagram showing a connecting state of the superconductive coils of the magnet shown in FIG. 7.

FIG. 8 is a wiring diagram showing the superconductive coils of the first and second superconductive coil assemblies 31 and 32 shown in FIG. 7. As shown in FIG. 8, all the coils of the first and second assemblies 31 and 32 are connected in series. One end of the coil e' of the first assembly 31 is connected to a power supply terminal T1, and one end of the coil h' of the second assembly 32 is connected to a power supply terminal T2. In FIG. 8, SW indicates a permanent current switch and R does a protective resistor for protecting the coil-damage when the quench phenomenon happened.

The operating effect of the second embodiment is substantially the same as that of the first embodiment. However, it can be obtained more greatly when the magnet 10 is relatively long since the two large-diameter coil sections V are provided in the vicinity of both the ends of the first superconductive coil assembly 31.

The first and second embodiments described above and shown in the figures have the following features and advantages.

(1) The superconductive magnetostatic field generating magnet according to the first embodiment includes a first superconductive coil assembly 11 having small-diameter coils a, a', b, b', c and c' and a large-diameter coil d, which surrounds a normal temperature bore 16 and generates first magnetism, and a second superconductive coil assembly 12 which surrounds the first assembly 11 and generates second magnetism. The magnet applies the synthesized magnetism of the first magnetism and second magnetism to an operation space 17 formed in the central part of the bore 16.

The first and second assemblies 11 and 12 are electrically connected in series to each other. The large-diameter coil, which is at least part (V) of the assembly 11, is separated from the small-diameter coils and arranged near to or outside the second assembly 12. The magnet generates such magnetism as to become substantially zero if the high-order magnetic components of the first magnetism and those of the second magnetism. Thus, the synthesized magnetism can be applied uniformly to the operation space 17 in the normal temperature bore 16.

In the superconductive magnetostatic field generating magnet described above, since at least part (e.g., the large-diameter coil d) of the first superconductive coil assembly 11 is arranged near to or outside the second superconductive coil assembly 12, the coils for generating high-order magnetic components are located far away from the operation space 17 of the bore 16, thus achieving highly uniform, large magnetic space in the bore 16 and at the same time reducing a leaking magnetic field outside the magnet 10. Since, furthermore, the magnet can be shortened, it can easily be carried and installed in the existing hospital and does not make a patient feel enclosed or confined.

(2) The superconductive magnetostatic field generating magnet according to the second embodiment includes a first superconductive coil assembly 31 which surrounds a normal temperature bore 16 and generates first magnetism and a second superconductive coil assembly 32 which surrounds the first assembly 31 and generates second magnetism. The magnet applies the synthesized magnetism of the first magnetism and second magnetism to an operation space 17 formed in the central part of the bore 16. The first and second assemblies 31 and 32 are electrically connected in series to each other. The first assembly 31 includes at least one coil d in the middle thereof in the direction of a magnetic axis 14, and the coil d is disposed close to or outside the second assembly 32. The magnet generates such magnetism as to become substantially zero if the high-order magnetic components of the first magnetism and those of the second magnetism. Thus, the synthesized magnetism can be applied uniformly to the operation space 17 in the normal temperature bore 16.

Consequently, the superconductive magnetostatic field generating magnet creates the same operating effect as that of the magnet described in above (1). Since the coil d of the first assembly 31 is arranged close to or outside the second assembly 32, a leaking electric field can be reduced and a highly uniform magnetic space can reliably be formed.

(3) The superconductive magnetostatic field generating magnet according to the second embodiment includes a first superconductive coil assembly 31 which surrounds a normal temperature bore 16 and generates first magnetism and a second superconductive coil assembly 32 which surrounds the first assembly 31 and generates second magnetism. The magnet applies the synthesized magnetism of the first magnetism and second magnetism to an operation space 17 formed in the central part of the bore 16. The first and second assemblies 31 and 32 are electrically connected in series to each other. The first assembly 31 includes at least one pair of coils d and d' near to both ends thereof in the direction of a magnetic axis 14, and the coil d is disposed close to or outside the second assembly 32. The magnet generates such magnetism as to become substantially zero if the high-order magnetic components of the first magnetism and those of the second magnetism. Thus, the synthesized magnetism can be applied uniformly to the operation space 17 in the normal temperature bore 16.

Consequently, the superconductive magnetostatic field generating magnet creates the same operating effect as that of the magnet described in above (1). Since the pair of coils d and d' of the first assembly 31 is arranged close to or outside the second assembly 32, a leaking electric field can be reduced and a highly uniform magnetic space can reliably be formed even though the first and second assemblies are shortened in their axial directions.

(4) In the superconductive magnetostatic field generating magnet as described in above (1) to (3), the zero-order magnetic components, which are generated in the central part of the magnet 10 from the large-diameter coil section V of the first superconductive coil assembly 11 (31) provided on the outer periphery of the second superconductive coil assembly 12 (32), are about 5% of the synthesized magnetism.

The degradation in magnetism uniformity, which is due to a shift (error in assembly) in arrangement among the small- and large-diameter coil sections W and V of the first assembly 11 (31) and the second assembly 12 (32) in its axial direction, is 1/10 that of a magnet having no large-diameter coils. For this reason, a device for generating highly uniform magnetism can be easily obtained.

(5) In the superconductive magnetostatic field generating magnet as described in above (1) to (4), the length of the magnet is L and the diameter of the normal temperature is D1, $L/D1 \leq 2.1$.

In this magnet, too, the features and advantages described in above (1) to (3) can easily be obtained. Since, furthermore, the magnet can be shortened, it can easily be carried and installed in the existing hospital.

(6) In the superconductive magnetostatic field generating magnet as described in above (1) to (5), the outside diameter of the magnet is D2 and the diameter of the normal temperature is D1, $D2/D1 \leq 2$.

In this magnet, too, the features and advantages described in above (1) to (3) can easily be obtained. Since, furthermore, the magnet can be decreased in outside diameter, it can easily be carried and installed in the existing hospital.

Consequently, in the superconductive magnetostatic field generating magnet and the MRI system according to the present invention, a magnetostatic field having high uniformity can be formed. The magnet and system can be made compact and thus easily carried and installed in the existing hospital, and do not make a patient feel enclosed or confined.

What is claimed is:

1. A magnetic field generating magnet comprising:

a first coil assembly having small-diameter coils and a large-diameter coil, for generating a main magnetic field in a predetermined area; and a second coil assembly for generating a shield magnetic field for actively shielding a magnetic field leaking from the main magnetic field, wherein each of the small-diameter coils and large-diameter coil of said first coil assembly is connected to said second coil assembly such that a direction of a current flow through the large-diameter coil of said first coil assembly is opposite to a direction of current flow through said second coil assembly, and the large-diameter coil of said first coil assembly is arranged near to or outside said second coil assembly.

2. The magnetostatic field generating magnet according to claim 1, wherein said small-diameter coils and said large-diameter coil are arranged in association with the second coil assembly and the predetermined area in such a manner that said small-diameter coils generate a low-order magnetic component in the predetermined area and said large-diameter coil generates a high-order magnetic component in the predetermined area.

3. The magnetostatic field generating magnet according to claim 1, wherein said large-diameter coil is separated from the predetermined area and the small-diameter coils.

4. The magnetostatic field generating magnet according to claim 1, wherein said second coil assembly is separated from the predetermined area and the first coil assembly, and said large-diameter coil is arranged in association with the second coil assembly.

5. The magnetostatic field generating magnet according to claim 1, wherein said small-diameter coils and said large-diameter coil is arranged along a magnetic axis through the predetermined area, and said large-diameter coil is arranged close to the predetermined area.

6. The magnetostatic field generating magnet according to claim 5, wherein said small-diameter coils are arranged on both sides of said large-diameter coil.

7. The magnetostatic field generating magnet according to claim 1, wherein said small-diameter coils and said large-diameter coil are arranged along a magnetic axis through the predetermined area, said small-diameter coils are arranged close to the predetermined area, and said large-diameter coil is arranged on both sides of said small-diameter coils.

8. The magnetostatic field generating magnet according to claim 1, wherein said large-diameter coil generates a zero-order magnetic field in a central part of the predetermined area, said zero-order magnetic field being about 5% of a synthesized magnetic field generated in the predetermined area.

9. The magnetostatic field generating magnet according to claim 1, wherein when a length of said magnet is L and a diameter of the predetermined area is D1, $L/D1 \leq 2.1$.

10. The magnetostatic field generating magnet according to claim 1, wherein when an outside diameter of said magnet is D2 and a diameter of the predetermined area is D1, $D2/D1 \leq 2$.

11. The magnetostatic field generating magnet according to claim 1, wherein said first and second coil assemblies are superconductive coil assemblies.

12. An MRI system comprising:

a container having a subject insertion space;

a first coil assembly contained in said container, together with a cooling medium, and having small-diameter coils and a large-diameter coil, for generating a main magnetic field in a predetermined area;

a second coil assembly container in said container together with the cooling medium, for generating a shield magnetic field for actively shielding a magnetic field leaking from the main magnetic field;

a gradient magnetic field generating section arranged in the subject insertion space of said container;

an RF unit arranged in the subject insertion space of said container; and an electric unit for controlling said gradient magnetic field generating section and said RF unit and generating magnetic resonance information in response to a magnetic resonance signal from RF unit, wherein each of the small-diameter coils and large-diameter coil of said first coil assembly is connected to said second coil assembly such that a direction of current flow through the large-diameter coil of said first coil assembly is opposite to a direction of current flow through said second coil assembly, and the large-diameter coil of said first coil assembly is arranged near to or outside said second coil assembly.

13. The MRI system according to claim 12, further comprising an active gradient shield coil section for active-gradient-shielding a gradient magnetic field generated by said gradient magnetic field generating section.

* * * * *